(12) United States Patent
Lee et al.

(10) Patent No.: US 9,871,079 B2
(45) Date of Patent: Jan. 16, 2018

(54) IMAGE SENSOR AND ELECTRONIC DEVICE INCLUDING THE SAME

(71) Applicant: Samsung Electronics Co., Ltd., Suwon-si, Gyeonggi-do (KR)

(72) Inventors: Gae Hwang Lee, Seongnam-si (KR); Kwang Hee Lee, Yongin-si (KR); Dong-Seok Leem, Hwaseong-si (KR); Yong Wan Jin, Seoul (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 193 days.

(21) Appl. No.: 14/657,133

(22) Filed: Mar. 13, 2015

(65) Prior Publication Data

US 2016/0087012 A1 Mar. 24, 2016

(30) Foreign Application Priority Data

Sep. 19, 2014 (KR) .................. 10-2014-0125123

(51) Int. Cl.
*H01L 27/30* (2006.01)
*H01L 51/44* (2006.01)

(52) U.S. Cl.
CPC .......... *H01L 27/307* (2013.01); *H01L 51/442* (2013.01); *H01L 2251/305* (2013.01); *H01L 2251/306* (2013.01); *H01L 2251/308* (2013.01); *Y02E 10/549* (2013.01)

(58) Field of Classification Search
CPC ..................................................... H01L 27/307
See application file for complete search history.

(56) References Cited

U.S. PATENT DOCUMENTS

| | | | |
|---|---|---|---|
| 7,924,504 B2 | 4/2011 | Su et al. | |
| 8,384,178 B2 | 2/2013 | Mabuchi | |
| 2013/0270663 A1 | 10/2013 | Lin et al. | |
| 2015/0115243 A1* | 4/2015 | Miyanami | H01L 51/448 257/40 |

FOREIGN PATENT DOCUMENTS

KR 101007198 B1 1/2011

* cited by examiner

*Primary Examiner* — John P Dulka
(74) *Attorney, Agent, or Firm* — Harness, Dickey & Pierce

(57) ABSTRACT

An image sensor includes a semiconductor substrate integrated with at least a photo-sensing device, a plurality of first electrodes disposed on the semiconductor substrate, an organic photoelectric conversion layer disposed on the first electrodes, and a second electrode disposed on the organic photoelectric conversion layer. The first electrodes include a light-transmitting electrode and a metal layer interposed between the semiconductor substrate and the light-transmitting electrode. The organic photoelectric conversion layer disposed on the first electrodes and the photo-sensing device absorb and/or sense light in different wavelength regions from each other. An electronic device including the image sensor is also provided.

19 Claims, 6 Drawing Sheets

IMAGE SENSOR AND ELECTRONIC DEVICE INCLUDING THE SAME

RELATED APPLICATIONS

This application claims priority to and the benefit of Korean Patent Application No. 10-2014-0125123 filed in the Korean Intellectual Property Office on Sep. 19, 2014, the entire contents of which are incorporated herein by reference.

BACKGROUND

1. Field

Example embodiments provide an image sensor and an electronic device.

2. Description of the Related Art

A photoelectric device converts light into an electrical signal using photoelectric effects. The photoelectric device may include a photodiode and/or a phototransistor, and may be applied to an image sensor, and/or a solar cell.

An image sensor including a photodiode requires relatively high resolution and thus a relatively small pixel. At present, a silicon photodiode is widely used, but has deteriorated sensitivity since the silicon photodiode has a relatively small absorption area due to relatively small pixels.

On the other hand, a color filter selectively absorbs light in a desired (or, alternatively, predetermined) wavelength region in each pixel when light enters an image sensor. A red filter, a blue filter, and a green filter are respectively disposed on a red pixel, a blue pixel, and a green pixel and selectively absorb red, blue, and green light, and the selectively absorbed light may be transferred to a photodiode of each pixel.

SUMMARY

The color filter absorbs light by itself, and thus loss of light before it is delivered to a photodiode is relatively high. Processes such as spin coating, UV exposure, and/or wet etching inhibit reduction of a pixel size down to a desirable size.

Example embodiments provide an image sensor increasing wavelength selectivity of each pixel as well as reducing the pixel size to a desirable size, thus improving sensitivity and light efficiency.

Example embodiments provide an electronic device including an image sensor.

According to example embodiments, an image sensor may include a semiconductor substrate integrated with at least one photo-sensing device, a first electrode disposed on the semiconductor substrate wherein the first electrode includes a light-transmitting electrode and a metal layer interposed between the semiconductor substrate and the light-transmitting electrode, an organic photoelectric conversion layer disposed on the first electrode wherein the organic photoelectric conversion layer absorbs light in a different wavelength region from a wavelength region sensed by the photo-sensing device, and a second electrode disposed on the organic photoelectric conversion layer.

The metal layer may contact the light-transmitting electrode.

The metal layer may be a semi-transmitting layer selectively transmitting light.

The metal layer may have a thickness of about 1 nm to about 30 nm.

The light-transmitting electrode may have a thickness of about 10 nm to about 800 nm.

The image sensor may further include a metal layer interposed between the light-transmitting electrode and the organic photoelectric conversion layer.

The photo-sensing device integrated in the semiconductor substrate may include a first photo-sensing device sensing light in a first wavelength region and a second photo-sensing device sensing light in a different wavelength region from the first wavelength region, wherein the organic photoelectric conversion layer absorbs light in a third wavelength region that is different from the first wavelength region and the second wavelength region.

The first photo-sensing device and the second photo-sensing device may be spaced apart from each other in a horizontal direction, and the light-transmitting electrode in the first electrode part positioned corresponding to the first photo-sensing device and the light-transmitting electrode in the first electrode part positioned corresponding to the second photo-sensing device may have different thicknesses from each other.

The first electrode part positioned corresponding to the first photo-sensing device may selectively transmit light in a first wavelength region, and The first electrode part positioned corresponding to the second photo-sensing device may selectively transmit light in a second wavelength region.

The first electrode may selectively reflect light in the third wavelength region to the organic photoelectric conversion layer.

The first wavelength region may be a blue wavelength region, the second wavelength region may be a red wavelength region, and the third wavelength region may be a green wavelength region.

The red wavelength region may have a maximum absorption wavelength ($\lambda_{max}$) of greater than about 580 nm and less than or equal to about 700 nm, the blue wavelength region may have a maximum absorption wavelength ($\lambda_{max}$) of greater than or equal to about 400 nm and less than about 500 nm, and the green wavelength region may have a maximum absorption wavelength ($\lambda_{max}$) of about 500 nm to about 580 nm.

The first photo-sensing device and the second photo-sensing device may be positioned at different depths from the surface of the semiconductor substrate.

The first photo-sensing device may sense light in a longer wavelength region than the second photo-sensing device, and the first photo-sensing device may be positioned more deeply than the second photo-sensing device from the surface of the semiconductor substrate.

The first photo-sensing device and the second photo-sensing device may be positioned while being stacked with each other at the upper and lower positions.

The metal layer may include at least one selected from aluminum (Al), magnesium (Mg), silver (Ag), nickel (Ni), cobalt (Co), lead (Pd), copper (Cu), gold (Au), and an alloy thereof.

The light-transmitting electrode may include at least one selected from indium tin oxide (ITO), indium zinc oxide (IZO), zinc oxide (ZnO), tin oxide (SnO), aluminum tin oxide (AITO), and fluorine-doped tin oxide (FTO).

The image sensor may further include an insulation layer interposed between the semiconductor substrate and the organic photoelectric conversion layer while contacting the first electrode, and the light-transmitting electrode in the first electrode may have a larger refractive index than that of the insulation layer.

The image sensor may not include an organic color filter between the semiconductor substrate and the organic photoelectric conversion layer.

According to example embodiments, an electronic device including the image sensor is provided.

DETAILED DESCRIPTION

Figure 1:
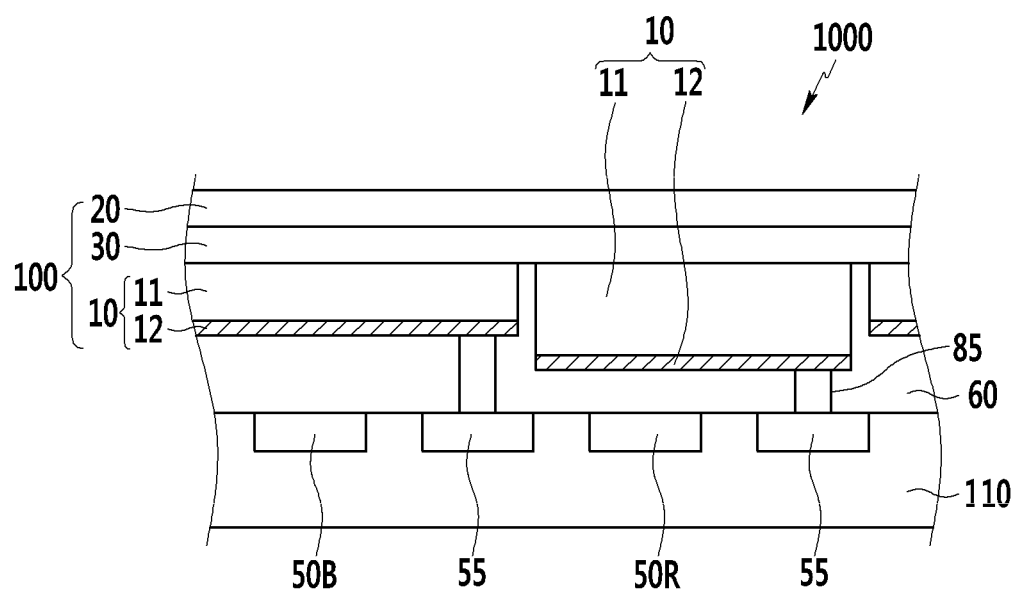
FIG. 1 is a cross-sectional view showing an image sensor according to example embodiments.

Example embodiments of the present invention will hereinafter be described in detail, and may be performed by one of ordinary skill in the art. However, this disclosure may be embodied in many different forms and should not be construed as limited to the example embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

It will be understood that, although the terms "first", "second", etc. may be used herein to describe various elements, components, regions, layers and/or sections, these elements, components, regions, layers and/or sections are not to be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments are not to be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, is to be interpreted as having a meaning that is consistent with their meaning in the context of the relevant art and will not be interpreted in an idealized or overly formal sense unless expressly so defined herein.

Referring to FIG. 1, a CMOS image sensor according to example embodiments will now be described.

FIG. 1 is a cross-sectional view showing a CMOS image sensor according to example embodiments.

Referring to FIG. 1, a CMOS image sensor 1000 according to example embodiments includes a semiconductor substrate 110, a first electrode 10 positioned on the semiconductor substrate 110, an organic photoelectric conversion layer 30 positioned on the first electrode 10, and a second electrode 20 positioned on the organic photoelectric conversion layer 30.

The semiconductor substrate 110 may be a silicon substrate, for example a monocrystalline silicon substrate. The semiconductor substrate 110 is integrated with a blue photo-sensing device 50B, a red photo-sensing device 50R, a charge storage device 55, and a transmission transistor (not shown). The blue photo-sensing device 50B and red photo-sensing device 50R may be photodiodes.

The blue photo-sensing device 50B, the red photo-sensing device 50R, the transmission transistor, and/or the charge storage device 55 may be integrated in each pixel, and for example, as shown in the drawing, the blue photo-sensing device 50B may be included in a blue pixel and the red photo-sensing device 50R may be included in a red pixel. Even though the charge storage device 55 is drawn only in a green pixel, the blue pixel and red pixel may respectively include a charge storage device connected with the blue photo-sensing device 50B and a charge storage connected with the red photo-sensing device 50R.

The blue photo-sensing device 50B and the red photo-sensing device 50R sense light, the information sensed by the photo-sensing devices may be transferred by the transmission transistor, the charge storage device 55 of the green pixel is electrically connected with an organic photoelectric device 100 to be described later, and the information of the charge storage device 55 may be transferred by the transmission transistor.

A metal wire (not shown) and a pad (not shown) are formed on the semiconductor substrate 110. In order to decrease signal delay, the metal wire and pad may be made of a metal having low resistivity, for example, aluminum (Al), copper (Cu), silver (Ag), and alloys thereof, but are not limited thereto. Further, it is not limited to the structure, and the metal wire and pad may be positioned under the blue photo-sensing device 50B, the red photo-sensing device 50R, and the charge storage device 55.

A lower insulation layer 60 is formed on the metal wire and the pad. The lower insulation layer 60 has a trench (not shown) exposing the photo-sensing devices 50B and 50R and charge storage device 55 of each pixel. The trench may be filled with fillers. The insulation layer 60 has a contact hole (not shown) exposing the pad and a through-hole 85 exposing the charge storage device 55 of the green pixel.

The insulation layer 60 may be positioned between the semiconductor substrate 110 and the organic photoelectric conversion layer 30. The lower insulation layer 60 may be made of an inorganic insulating material such as a silicon oxide and/or a silicon nitride, or a low dielectric constant (low K) material such as SiC, SiCOH, SiCO, and SiOF.

The first electrode 10 is formed on the insulation layer 60 while contacting the first electrode 10.

The first electrode 10 may be disposed in each pixel, and includes a light-transmitting electrode 11 and a metal layer 12 positioned between the semiconductor substrate 110 and the light-transmitting electrode 11.

The metal layer 12 may contact the light-transmitting electrode 11, and may be a semi-transmitting layer selectively transmitting light.

For example, the light-transmitting electrode 11 may be at least one of indium tin oxide (ITO), indium zinc oxide (IZO), zinc oxide (ZnO), tin oxide (SnO), aluminum tin oxide (AITO), and fluorine-doped tin oxide (FTO). The light-transmitting electrode 11 may be formed of a material having a relatively higher refractive index than, for example, that of the insulation layer 60. For example, the refractive index of the light-transmitting electrode 11 may be about 0.2 or higher than that of the insulation layer 60.

For example, the metal layer 12 may include at least one of aluminum (Al), magnesium (Mg), silver (Ag), nickel (Ni), cobalt (Co), lead (Pd), copper (Cu), gold (Au), and an alloy thereof.

When light enters the first electrode 10, the light-transmitting electrode 11 and the metal layer 12 may respectively reflect the light but transmit light of a desired (or, alternatively, predetermined) wavelength depending on the thickness of the light-transmitting electrode 11. This will be illustrated referring to FIG. 2.

Figure 2:
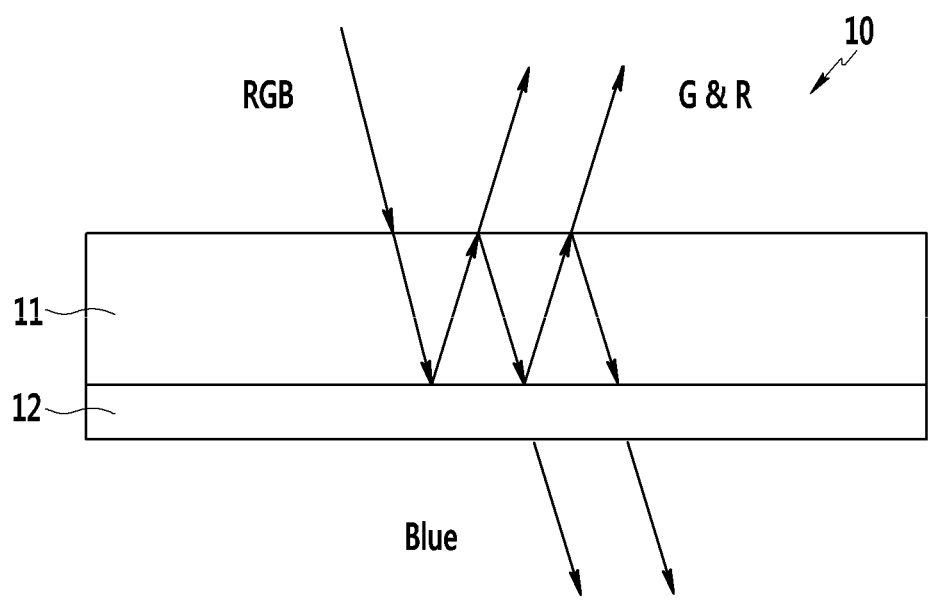
FIG. 2 is a reference view showing a working principle of a first electrode included in the image sensor of FIG. 1.

FIG. 2 is a reference view showing a working principle of a first electrode in the image sensor according to FIG. 1.

Referring to FIG. 2, the light in red (R), green (G), and blue (B) wavelength regions enters the first electrode 10 and passes through the light-transmitting electrode 11, and then the light in the red (R) and green (G) wavelength regions is respectively reflected against the metal layer 12 and the light-transmitting electrode 11, while the light in the blue (B) wavelength region passes through the metal layer 12. In other words, the light in the red (R), green (G), and blue (B) wavelength regions enters the first electrode 10, but the light in the red (R) and green (G) wavelength regions is reflected since constructive interference of the light in the red (R) and green (G) wavelength regions is generated on the incident side of the first electrode 10, while the light in the blue (B) wavelength region is transmitted since constructive interference of the light in the blue (B) wavelength region is generated on the opposite side to the incident side of the first electrode 10.

Because of generation of such a resonance, the first electrode 10 may selectively reflect or pass light in a particular wavelength region. FIG. 2 shows that the first electrode 10 selectively transmits light in the blue (B) wavelength region but reflects light in the red (R) and green (G) wavelength regions, but the first electrode 10 may be designed to selectively transmit light in the red (R) or green (G) wavelength regions design depending on the thickness of the light-transmitting electrode 11.

The light-transmitting electrode 11 may have a thickness ranging from about 10 nm to about 800 nm, and the thickness of the light-transmitting electrode 11 may be adjusted within the range depending on light which is desired to pass through the first electrode 10.

Referring to FIG. 1, the following is illustrated.

The organic photoelectric conversion layer 30 of the image sensor 1000, according to example embodiments, selectively absorbs light in a green wavelength region and transmits light in other wavelength regions besides the green wavelength region, that is, light in a blue wavelength region and a red wavelength region.

The organic photoelectric conversion layer 30 may include, for example, a p-type semiconductor and an n-type semiconductor, and the p-type semiconductor and the n-type semiconductor may form a pn junction. At least one of the p-type semiconductor and the n-type semiconductor selectively absorbs light in a green wavelength region to generate excitons, and then the generated excitons may be separated into holes and electrons to provide a photoelectric effect.

The p-type semiconductor material may be, for example, quinacridone or a derivative thereof, or subphthalocyanine or a derivative thereof, and the n-type semiconductor material may be, for example, a cyanovinyl group-containing thiophene derivative, subphthalocyanine or a derivative thereof, or fullerene or a fullerene derivative, but are not limited thereto.

The organic photoelectric conversion layer 30 may be a single layer and/or a multilayer. The organic photoelectric conversion layer 30 may be, for example, an intrinsic layer (I layer), a p-type layer/I layer, an I layer/n-type layer, a p-type layer/I layer/n-type layer, and/or a p-type layer/n-type layer.

The intrinsic layer (I layer) may include the p-type semiconductor and the n-type semiconductor in a thickness ratio of about 1:100 to about 100:1. The semiconductors may be included in a thickness ratio ranging from about 1:50 to about 50:1 within the range, specifically, about 1:10 to about 10:1, and more specifically, about 1 to about 1. When the p-type and n-type semiconductors have a composition ratio within the range, an exciton may be effectively produced, and a pn junction may be effectively formed.

The p-type layer may include the p-type semiconductor, and the n-type layer may include the n-type semiconductor.

The organic photoelectric conversion layer 30 may have a thickness of about 1 nm to about 500 nm. Within the range, the organic photoelectric conversion layer 30 may have a thickness of about 5 nm to about 300 nm. When the organic photoelectric conversion layer 30 has a thickness within the range, the organic photoelectric conversion layer 30 may effectively absorb light, effectively separate holes from electrons, and deliver them, effectively improving photoelectric conversion efficiency.

The second electrode 20 may be positioned on the organic photoelectric conversion layer 30 and may be a light-transmitting electrode into which light enters. The second electrode 20 may be made of, for example, a transparent conductor, e.g., indium tin oxide (ITO) or indium zinc oxide (IZO). The second electrode 20 may be a metal thin layer having a thin thickness of several nanometers or several tens of nanometers or a metal thin layer having a thin thickness of several nanometers to several tens of nanometers doped with a metal oxide. One of the first electrode 10 and the second electrode 20 is an anode and the other is a cathode.

The first electrode 10, the organic photoelectric conversion layer 30, and the second electrode 20 provide an organic photoelectric device, and when light is incident from the second electrode 20 and the organic photoelectric conversion layer 30 absorbs light in a green wavelength region, excitons may be produced from the inside. The excitons are separated into holes and electrons in the organic photoelectric conversion layer 30, and the separated holes are transported to an anode that is one of the first electrode 10 and the second electrode 20, and the separated electrons are transported to the cathode that is the other of the first electrode 10 and the second electrode 20 so as to flow a current. The separated electrons or holes may be collected in the charge storage device 55. Light in other wavelength regions except for a green wavelength region pass the first electrode 11 and may be sensed by the blue photo-sensing device 50B or the red photo-sensing device 50R.

The organic photoelectric device 100 may be formed on the front of the image sensor and absorb light thereon, and thus increase a light area and bring about high light absorption efficiency.

In FIG. 1, the blue photo-sensing device 50B sensing light in a blue wavelength region and the red photo-sensing device 50R sensing light in a red wavelength region are integrated in the semiconductor substrate 110, and the organic photoelectric device 100 includes the organic photoelectric conversion layer 30 selectively absorbing light in a green wavelength region. However, the organic photoelectric device 100 is not limited to the above structure shown in FIG. 1. A photo-sensing device sensing light in a blue wavelength region and a photo-sensing device sensing light in a green wavelength region may be integrated in the semiconductor substrate 110, and the organic photoelectric device 100 may include an organic photoelectric conversion layer selectively absorbing light in a red wavelength region. Alternatively, a photo-sensing device sensing light in a red wavelength region and a photo-sensing device sensing light in a green wavelength region may be integrated in the semiconductor substrate 110, and the organic photoelectric device 100 may include an organic photoelectric conversion layer selectively absorbing light in a blue wavelength region.

Herein, the red wavelength region may have a maximum absorption wavelength ($\lambda_{max}$) of greater than about 580 nm and less than or equal to about 700 nm, the blue wavelength region may have a maximum absorption wavelength ($\lambda_{max}$) of greater than or equal to about 400 nm and less than about 500 nm, and the green wavelength region may have a maximum absorption wavelength ($\lambda_{max}$) of about 500 nm to about 580 nm.

The image sensor 1000 according to the example embodiments include the first electrode 10 including the light-transmitting electrode 11 and the metal layer 12, and thereby color separation characteristics are improved without equipping a separate organic color filter layer. In example embodiments, an organic color filter layer having a relatively large thickness may be undesirable and may be omitted. The metal layer 12 having a thickness of about 1 nm to about 30 nm, about 5 nm to about 20 nm, or about 10 nm to about 15 nm, may be used as a part of color filter and thereby down-sizing of a pixel may be realized.

In addition, as described above, since the generation of the resonance increases reflectance of light in a particular wavelength region, the first electrode 10 selectively reflects light in a green wavelength region to the organic photoelectric conversion layer 30 and may increase a green light absorption rate of the organic photoelectric conversion layer 30 when the organic photoelectric conversion layer 30 absorbs the light in a green wavelength region.

Figure 3:
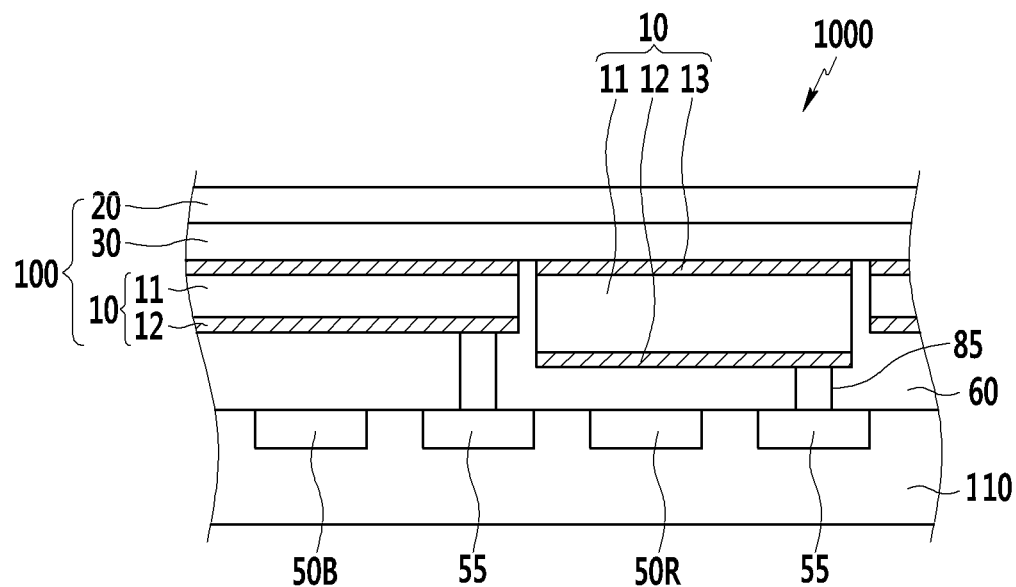
FIG. 3 is a cross-sectional view showing an image sensor according to example embodiments.

FIG. 3 is a cross-sectional view showing an image sensor according to example embodiments.

Referring to FIG. 3, the image sensor 1000 according to the present embodiment includes a semiconductor substrate 110, a first electrode 10 positioned on the semiconductor substrate 110, an organic photoelectric conversion layer 30 positioned on the first electrode 10, and a second electrode 20 positioned on the organic photoelectric conversion layer 30, wherein the first electrode 10 includes a light-transmitting electrode 11 and a metal layer 12 interposed between the light-transmitting electrode 11 and the semiconductor substrate 110, like the example embodiments.

The semiconductor substrate 110 may be a silicon substrate, for example a monocrystalline silicon substrate. The semiconductor substrate 110 is integrated with a blue photo-sensing device 50B, a red photo-sensing device 50R, a charge storage device 55, and a transmission transistor (not shown). The blue photo-sensing device 50B and the red photo-sensing device 50R may be photodiodes.

The blue photo-sensing device 50B, the red photo-sensing device 50R, the transmission transistor, and/or the charge storage device 55 may be integrated in each pixel, and for example, as shown in the drawing, the blue photo-sensing device 50B may be included in a blue pixel and the red photo-sensing device 50R may be included in a red pixel. Even though the charge storage device 55 is drawn only in a green pixel, the blue pixel and red pixel may respectively include a charge storage device connected with the blue photo-sensing device 50B and a charge storage device connected with the red photo-sensing device 50R.

In the example embodiment, the first electrode 10 further includes a metal layer 13 between the light-transmitting electrode 11 and the organic photoelectric conversion layer 30, unlike the example embodiments. The upper metal layer 13 and the lower metal layer 12 may each have a thickness of about 1 nm to about 30 nm, and their thicknesses may be the same as or different from each other. The materials of the upper metal layer 13 and the lower metal layer 12 may be the same as described in the example embodiment, and may be the same metal or be different from each other. The upper metal layer 13 and the lower metal layer 12 may contact the light-transmitting electrode 11, and may be a semi-transmitting layer selectively transmitting light.

In an image sensor 1000 according to the example embodiment, light incident to the first electrode 10 is reflected back and forth between the upper metal layer 13 and the lower metal layer 12, and herein, light at a desired (or, alternatively, predetermined) wavelength is transmitted depending on the thickness of the first electrode 10 while the light of the rest of the wavelengths is reflected. This will be illustrated referring to FIG. 4.

Figure 4:
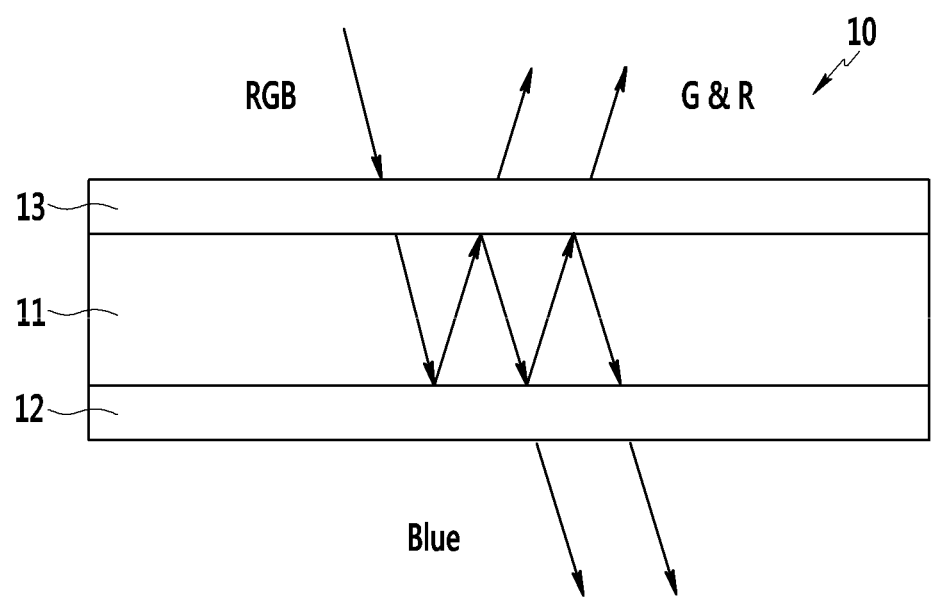
FIG. 4 is a reference view showing a working principle of a first electrode included in the image sensor of FIG. 3.

FIG. 4 is a reference view showing a principle of a first electrode in the image sensor according to FIG. 3.

Referring to FIG. 4, light in red (R), green (G), and blue (B) wavelength regions entering the first electrode 10 is reflected back and forth between the upper metal layer 13 and the lower metal layer 12, while the light in a blue (B) wavelength region passes through the metal layer 12. In other words, when light in red (R), green (G), and blue (B) wavelength regions enters the first electrode 10, light in the red (R) and green (G) wavelength regions is reflected due to constructive interference on the incident side of the first electrode 10, while light in the blue (B) wavelength region is transmitted due to constructive interference of the light in the blue (B) wavelength region on the opposite side to the incident side of the first electrode 10.

FIG. 4 shows that the first electrode 10 selectively transmits light in the blue (B) wavelength region but reflects light in the red (R) and green (G) wavelength regions, but may be designed to selectively pass the light in the red (R) or green (G) wavelength regions depending on the thickness of the light-transmitting electrode 11.

The following will be illustrated referring to FIG. 3.

The organic photoelectric conversion layer 30 of the image sensor 1000 according to example embodiments selectively absorbs light in a green wavelength region and transmits light in other wavelength region besides the green wavelength region, that is, light in a blue wavelength region and a red wavelength region.

The organic photoelectric device 100 may be formed on the front of the image sensor and absorb light thereon, and thus increase a light area and bring about high light absorption efficiency.

In FIG. 3, the blue photo-sensing device 50B sensing light in a blue wavelength region and the red photo-sensing device 50R sensing light in a red wavelength region are integrated in the semiconductor substrate 110, and the organic photoelectric device 100 includes the organic photoelectric conversion layer 30 selectively absorbing light in a green wavelength region. However, the organic photoelectric device 100 is not limited to the above structure shown in FIG. 3. A photo-sensing device sensing light in a blue wavelength region and a photo-sensing device sensing light in a green wavelength region may be integrated in the semiconductor substrate 110, and the organic photoelectric device 100 may include an organic photoelectric conversion layer selectively absorbing light in a red wavelength region. Alternatively, a photo-sensing device sensing light in a red wavelength region and a photo-sensing device sensing light in a green wavelength region may be integrated in the semiconductor substrate 110, and the organic photoelectric device 100 may include an organic photoelectric conversion layer selectively absorbing light in a blue wavelength region. The second electrode 20 and the organic photoelectric conversion layer 30 are the same as described in FIG. 1.

The image sensor 1000 according to an example embodiment includes the first electrode 10 including the light-transmitting electrode 11 and the two metal layers 12 and 13, and thereby color separation characteristics are improved without equipping a separate organic color filter layer. An organic color filter layer having a relatively large thickness may be undesirable and may be omitted. The metal layers 12 and 13 having a nanometer-sized thickness can be utilized, in place of organic color filter layer, in order to reduce the pixel size; and thereby down-sizing of a pixel size may be realized.

In addition, as described above, since the first electrode 10 increases reflectance of light in a particular wavelength region due to generation of the resonance, and thus reflects light in a green wavelength region toward the organic photoelectric conversion layer 30 when the organic photoelectric conversion layer 30 absorbs the light in the green wavelength region, the organic photoelectric conversion layer 30 may absorb green light at a much higher absorption rate.

As shown in FIGS. 1 and 3, the blue photo-sensing device 50B sensing light in a blue wavelength region and the red photo-sensing device 50R sensing light in a red wavelength region are spaced apart from each other in a horizontal direction, and the light-transmitting electrode in the first electrode part positioned corresponding to the blue photo-sensing device 50B and the light-transmitting electrode in the first electrode part positioned corresponding to the red photo-sensing device 50R may have different thicknesses from each other. The first electrode part positioned corresponding to the blue photo-sensing device 50B may selectively transmit light in a blue wavelength region, and the first electrode part positioned corresponding to the red photo-sensing device 50R may selectively transmit light in a red wavelength region. The first electrode 10 may selectively reflect the light in a green wavelength region to the organic photoelectric conversion layer 30.

In the image sensor 1000 of FIGS. 1 and 3, the blue photo-sensing device 50B and the red photo-sensing device 50R are positioned at the same depth from the surface of the semiconductor substrate 110, but are not limited thereto, and the blue photo-sensing device 50B and the red photo-sensing device 50R may be positioned at substantially different depths from the surface of the semiconductor substrate 110. For example, the red photo-sensing device 50R may be positioned more deeply from the surface of the semiconductor substrate 110 than the blue photo-sensing device 50B.

Figure 5:
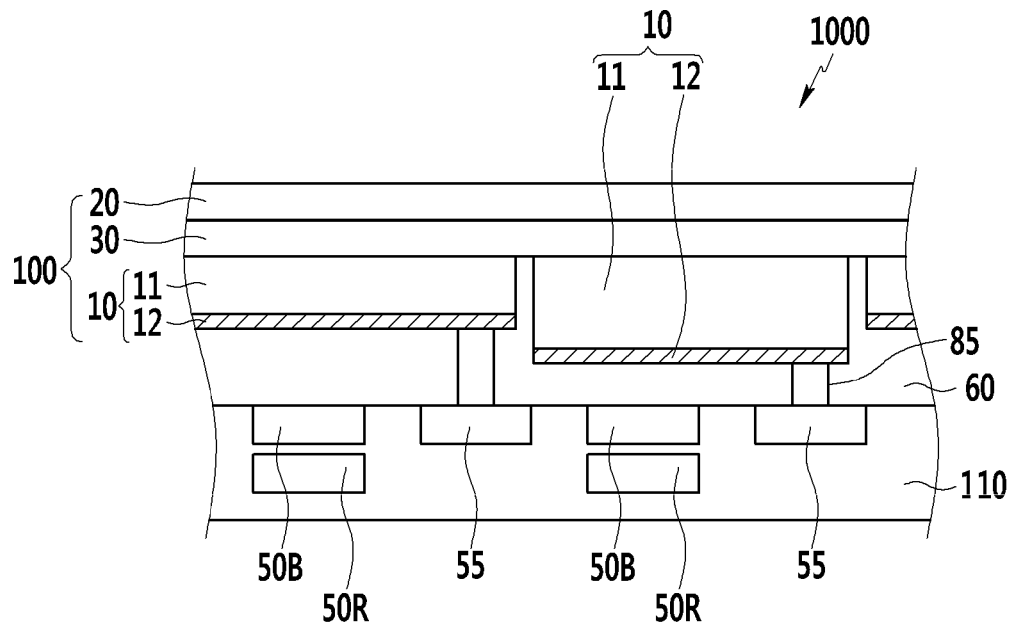
FIG. 5 is a cross-sectional view showing an image sensor according to yet example embodiments.

FIG. 5 is a schematic cross-sectional view showing a CMOS image sensor according to example embodiments Referring to FIG. 5, the image sensor 1000 according to the present embodiment includes a semiconductor substrate 110, a first electrode 10 positioned on the semiconductor substrate 110, an organic photoelectric conversion layer 30 positioned on the first electrode 10, and a second electrode 20 positioned on the organic photoelectric conversion layer 30, wherein the first electrode 10 includes a light-transmitting electrode 11 and a metal layer 12 interposed between the light-transmitting electrode 11 and the semiconductor substrate 110, like the example embodiments. The metal layer 12 may be positioned contacting the light-transmitting electrode 11, and may be a semi-transmitting layer selectively transmitting light.

The semiconductor substrate 110 may be a silicon substrate, for example a monocrystalline silicon substrate. The semiconductor substrate 110 is integrated with a blue photo-sensing device 50B, a red photo-sensing device 50R, a charge storage device 55, and a transmission transistor (not shown). The blue photo-sensing device 50B and the red photo-sensing device 50R may be photodiodes.

However, the image sensor 1000 according to the example embodiment includes the blue photo-sensing device 50B and red photo-sensing device 50R that are stacked with each other, unlike the example embodiment. The blue photo-sensing device 50B and the red photo-sensing device 50R are electrically connected with the charge storage device (not shown), and may be transferred by a transmission transistor.

As described above, an organic photoelectric device selectively absorbing light in a green wavelength region has a stacked structure of a red photo-sensing device and a blue photo-sensing device, and thus further decreases the size of an image sensor, and resultantly crosstalk due to a thickness increase of the image sensor is reduced. In addition, as described above, the first electrode 10 selectively reflects light in a green wavelength region to the organic photoelectric conversion layer 30 due to generation of the resonance, and thus may further increase a green light absorption rate of the organic photoelectric conversion layer 30.

Figure 6:
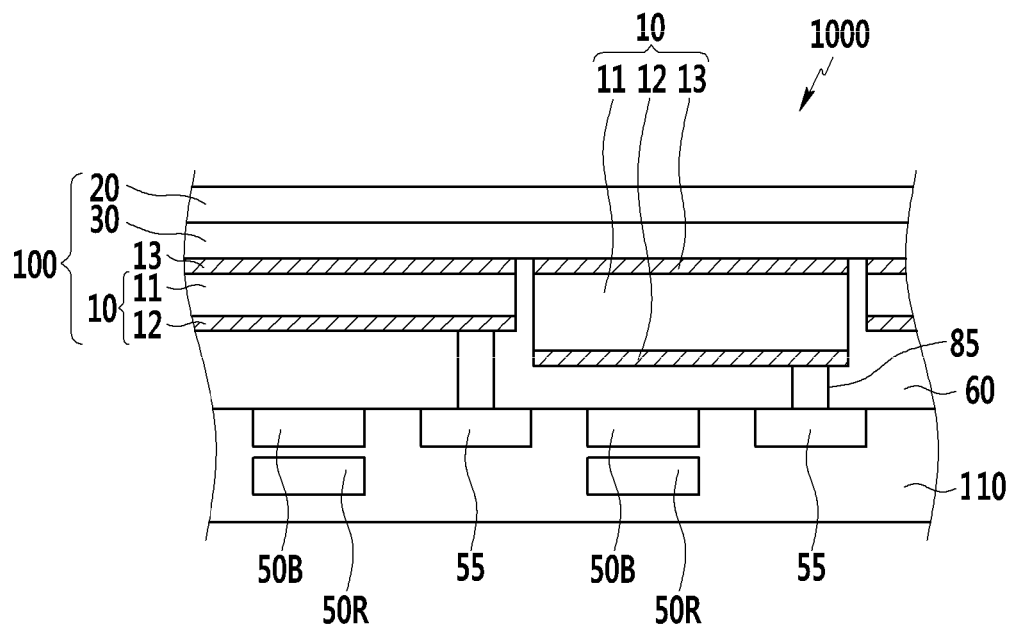
FIG. 6 is a cross-sectional view showing an image sensor according to still another example embodiments.

FIG. 6 is a schematic cross-sectional view showing a CMOS image sensor according to example embodiments Referring to FIG. 6, the first electrode 10 further may include a metal layer 13 between the light-transmitting electrode 11 and the organic photoelectric conversion layer 30, unlike the image sensor of FIG. 5. The upper metal layer 13 and the lower metal layer 12 may each have a thickness of about 1 nm to about 30 nm, and their thicknesses may be the same as or different from each other. The materials of the upper metal layer 13 and the lower metal layer 12 may be the same as described in the example embodiment, and may be the same metal or be different from each other. The upper metal layer 13 and the lower metal layer 12 may contact the light-transmitting electrode 11, and may be semi-transmitting layers selectively transmitting light.

The image sensor may include a first electrode having a metal layer between the semiconductor substrate and the light-transmitting electrode and thus selectively transmits and reflects light in a particular wavelength region, and may increase light absorbance of an organic photoelectric conversion layer and thus photo-conversion efficiency as well as have high separation characteristics without including a separate organic color filter layer. In addition, the image sensor has a smaller thickness and thus may secure light absorption characteristics without a separate micro-lens.

The image sensor may be applied to various electronic devices, for example a mobile phone, a digital camera, and/or a biosensor without limitation.

Hereinafter, the present disclosure is illustrated in more detail with reference to examples. However, these examples are exemplary, and the present disclosure is not limited thereto.

Evaluation 1: Light Absorbance

Improvement of light absorbance of an image sensor manufactured by applying a first electrode according to example embodiments is evaluated through optical simulation.

The optical simulation is calculated by using Transform Matrix and a MATLAB program.

As shown in FIG. 3, the image sensor has a structure in which a blue photo-sensing device 50B and a red photo-sensing device 50R are spaced apart from each other in a horizontal direction and positioned at the same depth from the semiconductor substrate 110, and thus is assumed to include the first electrode having a structure of a stacked metal layer (Ag)/light-transmitting electrode (ITO)/metal layer (Ag).

In a part of the first electrode where it corresponds to the blue photo-sensing device 50B, the ITO layer is 60 nm thick, an Ag layer on the ITO layer is 10 nm thick, and another Ag layer beneath the ITO layer is 15 nm thick. In a part of the first electrode where it corresponds to the red photo-sensing device 50R, the ITO layer is 130 nm thick, the Ag layer on the ITO layer is 10 nm thick, and the other Ag layer beneath the ITO layer is 15 nm thick. The organic photoelectric conversion layer is a 40 nm-thick organic material layer (Abs. coeff=–1.4×10$^5$ [/cm]).

A light absorption rate in a green wavelength region in the organic photoelectric conversion layer of an image sensor according to the above condition is evaluated.

Figure 7:
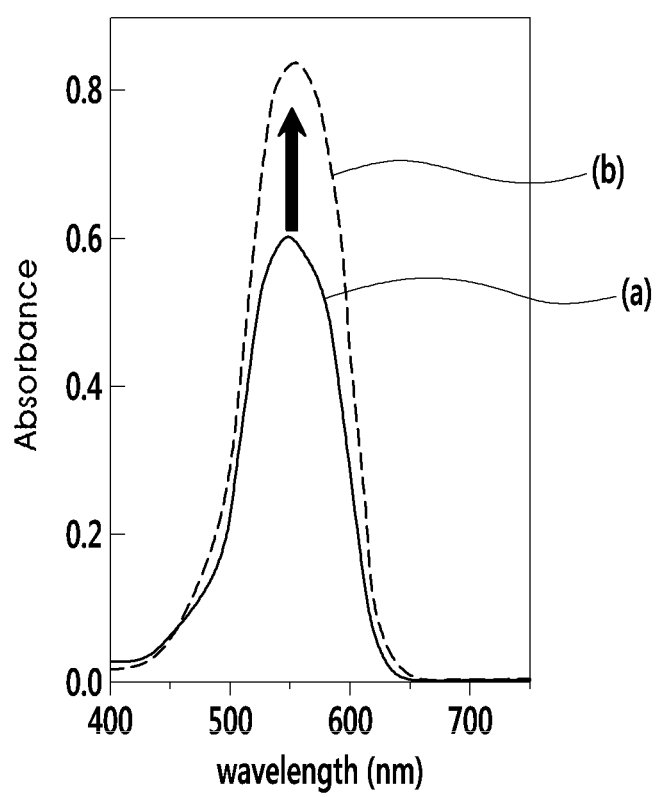
FIG. 7 is a graph showing light absorbance in a green wavelength region of an image sensor according to example embodiments.

FIG. 7 is a graph showing light absorbance in a green wavelength region depending on a wavelength of the image sensor according to the condition.

Referring to FIG. 7, an image sensor (b) including a first electrode having a structure of a stacked metal layer (Ag)/light-transmitting electrode (ITO)/metal layer (Ag) with a predetermined or given thickness does not show much light absorbance change in blue and red wavelength regions, while an image sensor (a) including a first electrode only including a 150 nm-thick light-transmitting electrode (ITO) having a stacked structure with a predetermined or given thickness showed much light absorbance change in a green wavelength region.

Evaluation 2: Wavelength Selectivity

Wavelength selectivity of an image sensor manufactured by using a first electrode according to example embodiments is evaluated through optical simulation.

The same program and condition as used in Evaluation 1 are used in Evaluation 2.

Figure 8:
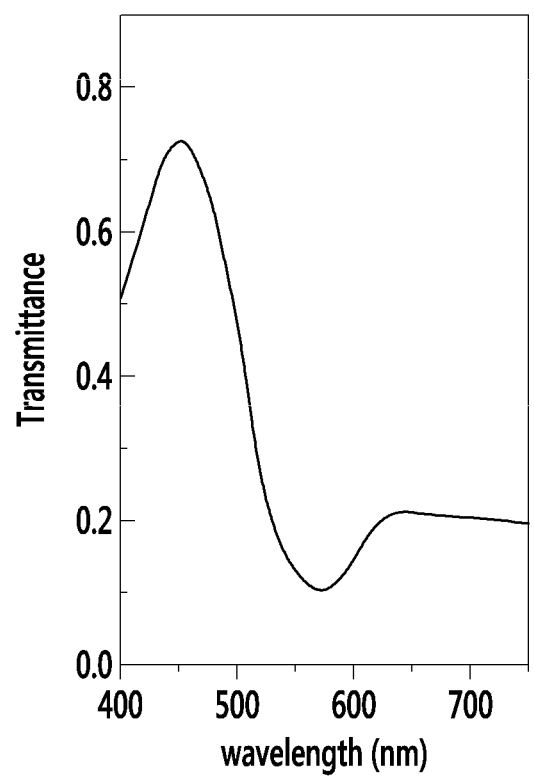
FIG. 8 is a graph showing light transmittance in a blue wavelength region of an image sensor according to example embodiments.
Figure 9:
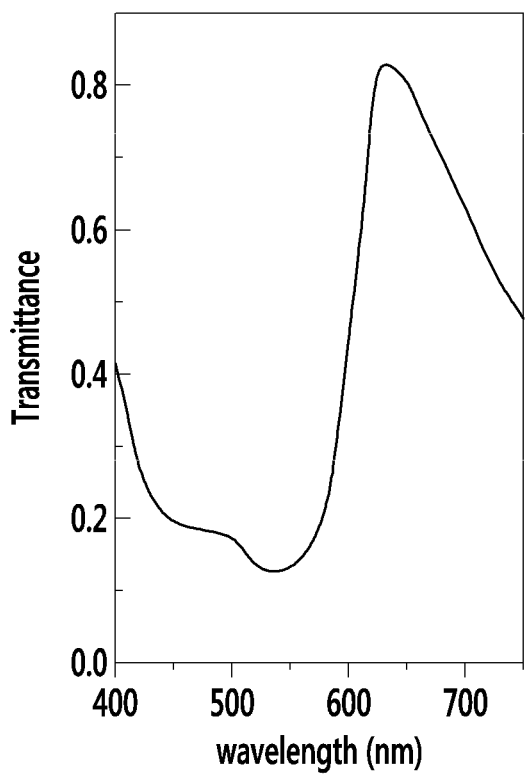
FIG. 9 is a graph showing light transmittance in a red wavelength region of an image sensor according to example embodiments.

FIG. 8 is a graph showing light transmittance of an image sensor depending on a wavelength in a blue wavelength region under the condition, and FIG. 9 is a graph showing light transmittance of an image sensor depending on a wavelength in a red wavelength region under the condition.

Referring to FIGS. 8 and 9, an image sensor including a first electrode having a structure of a stacked metal layer (Ag)/light-transmitting electrode (ITO)/metal layer (Ag) having a desired (or, alternatively, predetermined) thickness has wavelength selectivity regarding blue and green wavelength regions without a particular organic color filter.

While this disclosure has been described in connection with what is presently considered to be practical example embodiments, it is to be understood that the invention is not limited to the disclosed example embodiments, but, on the contrary, is intended to cover various modifications and equivalent arrangements included within the spirit and scope of the appended claims.

What is claimed is:

1. An image sensor, comprising:
    a semiconductor substrate integrated with at least a photo-sensing device;
    at least a first electrode on the semiconductor substrate, the first electrode including a light-transmitting electrode and a first metal layer between the semiconductor substrate and the light-transmitting electrode;
    an organic photoelectric conversion layer on the first electrode, the organic photoelectric conversion layer absorbing light in a different wavelength region from a wavelength region sensed by the photo-sensing device; and
    a second electrode on the organic photoelectric conversion layer,
    wherein the first metal layer is a semi-transmitting layer configured to selectively transmit light.

2. The image sensor of claim 1, wherein the first metal layer contacts the light-transmitting electrode.

3. The image sensor of claim 1, wherein the first metal layer has a thickness of about 1 nm to about 30 nm.

4. The image sensor of claim 1, wherein the light-transmitting electrode has a thickness of about 10 nm to about 800 nm.

5. The image sensor of claim 1, further comprising:
    a second metal layer between the light-transmitting electrode and the organic photoelectric conversion layer.

6. The image sensor of claim 1, wherein the semiconductor substrate includes a first photo-sensing device sensing light in a first wavelength region and a second photo-sensing device sensing light in a second wavelength region different from the first wavelength region,
  wherein the organic photoelectric conversion layer absorbs light in a third wavelength region that is different from the first wavelength region and the second wavelength region.

7. The image sensor of claim 6, wherein
  the first photo-sensing device and the second photo-sensing device are spaced apart in a horizontal direction, and wherein
  at least two first electrodes are disposed on the semiconductor substrate, and each of the first electrodes is positioned corresponding to the first photo-sensing device and second photo-sensing device, and wherein light transmitting electrodes of the first electrodes have different thicknesses.

8. The image sensor of claim 7, wherein a particular first electrode of the at least two first electrodes that is positioned corresponding to the first photo-sensing device is configured to selectively transmit light in the first wavelength region, and
  a separate first electrode of the at least two first electrodes that is positioned corresponding to the second photo-sensing device is configured to selectively transmit light in the second wavelength region.

9. The image sensor of claim 6, wherein the first electrode is configured to selectively reflect light in the third wavelength region to the organic photoelectric conversion layer.

10. The image sensor of claim 6, wherein the first wavelength region is a blue wavelength region, the second wavelength region is a red wavelength region, and the third wavelength region is a green wavelength region.

11. The image sensor of claim 10, wherein
  the red wavelength region has a maximum absorption wavelength ($\lambda_{max}$) of greater than about 580 nm and less than or equal to about 700 nm,
  the blue wavelength region has a maximum absorption wavelength ($\lambda_{max}$) of greater than or equal to about 400 nm and less than about 500 nm, and
  the green wavelength region has a maximum absorption wavelength ($\lambda_{max}$) of about 500 nm to about 580 nm.

12. The image sensor of claim 6, wherein the first photo-sensing device and the second photo-sensing device are positioned at different depths from a surface of the semiconductor substrate.

13. The image sensor of claim 12, wherein
  the first photo-sensing device may sense light in a longer wavelength region than the second photo-sensing device, and
  the first photo-sensing device is positioned more deeply than the second photo-sensing device from the surface of the semiconductor substrate.

14. The image sensor of claim 12, wherein the first photo-sensing device and the second photo-sensing device are stacked with each other at an upper and lower positions.

15. The image sensor of claim 1, wherein the first metal layer includes at least one of aluminum (Al), magnesium (Mg), silver (Ag), nickel (Ni), cobalt (Co), lead (Pd), copper (Cu), gold (Au), and an alloy thereof.

16. The image sensor of claim 1, wherein the light-transmitting electrode includes at least one of indium tin oxide (ITO), indium zinc oxide (IZO), zinc oxide (ZnO), tin oxide (SnO), aluminum tin oxide (AlTO), and fluorine-doped tin oxide (FTO).

17. The image sensor of claim 1, further comprising:
  an insulation layer between the semiconductor substrate and the organic photoelectric conversion layer while contacting the first electrode, and
  the light-transmitting electrode in the first electrode has a larger refractive index than that of the insulation layer.

18. The image sensor of claim 1, wherein the image sensor does not include an organic color filter between the semiconductor substrate and the organic photoelectric conversion layer-.

19. The image sensor of claim 1, wherein the image sensor is configured to be used with electronic devices including at least one of a mobile phone, a digital camera, and a biosensor.

* * * * *